(12) United States Patent
Rana et al.

(10) Patent No.: US 10,522,218 B2
(45) Date of Patent: Dec. 31, 2019

(54) METHODS AND APPARATUSES TO REDUCE POWER DISSIPATION IN A STATIC RANDOM ACCESS MEMORY (SRAM) DEVICE

(71) Applicant: Samsung Electronics Co., Ltd., Suwon-si, Gyeonggi-do (KR)

(72) Inventors: Parvinder Kumar Rana, Bangalore (IN); Lava Kumar Pulluru, Bangalore (IN); Shuvadeep Kumar, Bangalore (IN); Ankur Gupta, Bangalore (IN)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/190,278

(22) Filed: Nov. 14, 2018

(65) Prior Publication Data
US 2019/0147943 A1    May 16, 2019

(30) Foreign Application Priority Data

Nov. 15, 2017   (IN) .............................. 201741040881
Nov. 12, 2018   (IN) .............................. 2017 41040881

(51) Int. Cl.
   *G11C 11/419*   (2006.01)
   *G11C 11/418*   (2006.01)

(52) U.S. Cl.
   CPC .......... *G11C 11/419* (2013.01); *G11C 11/418* (2013.01)

(58) Field of Classification Search
   CPC ............................ G11C 11/419; G11C 11/418
   USPC ........................................................... 365/154
   See application file for complete search history.

(56) References Cited

U.S. PATENT DOCUMENTS

| | | | |
|---|---|---|---|
| 6,512,718 B2 | 1/2003 | Lee | |
| 9,728,250 B2 * | 8/2017 | Chung | .................. G06F 3/0619 |
| 10,056,133 B2 * | 8/2018 | Baek | ........................ G11C 5/14 |
| 2013/0077387 A1 | 3/2013 | Yabuuchi | |

OTHER PUBLICATIONS

Majumdar et al. "Low Power Single Bitline 6T SRAM Cell With High Read Stability" 2011 International conference on Recent Trends in Information Systems 169-174 (2011).
Prakash et al. "Dynamic Power Reduction in SRAM" International Journal of Engineering Research and Applications (IJERA) 2(5):1781-1784 (2012).

* cited by examiner

*Primary Examiner* — Fernando Hidalgo
(74) *Attorney, Agent, or Firm* — Myers Bigel, P.A.

(57) ABSTRACT

Embodiments herein provide a method for reducing power dissipation in a Static Random Access Memory (SRAM) device. The method includes determining, by the tracking circuit, whether at least one SRAM Bit-Cell discharges power from at least one BL exceeding a pre-defined voltage level required for a sense amplifier to perform a read operation. Furthermore, the method includes reducing, by the WL driver, the power discharged from the at least one BL by controlling a WL voltage power supply switch of the WL driver using a SAE signal and adjusting a pulse width of the at least one WL to pull down the at least one WL using a NMOS circuit when the at least one SRAM Bit-Cell discharges the power from the at least one BL exceeding the pre-defined voltage level.

20 Claims, 5 Drawing Sheets

METHODS AND APPARATUSES TO REDUCE POWER DISSIPATION IN A STATIC RANDOM ACCESS MEMORY (SRAM) DEVICE

CROSS-REFERENCE TO RELATED APPLICATIONS

This application claims priority from Indian Patent Application No. 201741040881, filed on Nov. 15, 2017 and No. 201741040881, filed on Nov. 12, 2018, in the Indian Intellectual Property Office, and all the benefits accruing therefrom under 35 U.S.C. 119, the entire contents of which are hereby incorporated herein by reference.

BACKGROUND

The present disclosure relates to the field of semiconductor memory, and more particularly to methods and apparatuses for reducing power dissipation in a Static Random Access Memory (SRAM) device.

Referring to FIG. 1, a Static Random Access Memory (SRAM) device 100 is depicted. During a read operation, the SRAM device 100 is provided with an address decoder 104 for receiving an address and an internal clock signal (CLK_INT) generated by an internal clock generator 102. The internal clock generator 102 generates the internal clock signal using an external clock (CLK) and a Chip Selection Signal (CSN). The address decoder 104 decodes the address and generates a Word-Line (WL) signal to enable a WL. A WL driver 106 receives the WL signal from the address decoder 104 and transmits the WL signal to a SRAM Bit-Cell 108 which the WL signal enables the WL to select a Bit-Line (BL) in the SRAM Bit-Cell 108. The WL driver 106 is driven by a WL voltage (VDDWL) power supply switch 114. The WL voltage (VDDWL) power switch 114 is derived from the Chip Selection Signal (CSN) and a cell voltage supply (VDDCE).

Further, a tracking circuit 110 generates a Sense Amplifier Enable (SAE) signal and RESET signal using the internal clock signal generated by the internal clock generator 102. The tracking circuit 100 generates the SAE signal and RESET signal when WL selects the BL in the SRAM Bit-Cell 108. The SAE signal enables a Sense Amplifier 112 to perform a read operation by reading a data array of the SRAM Bit-Cell 108.

Referring to FIG. 2, during the read operation in the SRAM device 100, the WL selects at least one BL in the SRAM Bit-Cell 108. The tracking circuit 110 generates the SAE signal to enable the sense amplifier 112 to read the data of the array of the SRAM Bit-Cell 108, as mentioned in FIG. 1. When the sense amplifier 112 reads the data of the array of the SRAM Bit-Cell 108, the SRAM Bit-Cell 108 discharges power stored in the at least one selected BL and the power stored in the BLs which are unselected by the WL. The power discharging of the BLs is common during the read operation unless the power discharging of BLs exceeds a pre-defined voltage level required for the sense amplifier 112 to perform the read operation. As the power levels of the BLs are discharged, the current flow in the SRAM Bit-Cell 108 increases.

The power discharging of BLs may exceed a pre-defined voltage due to reasons such as: (i) When there is no change of state of the WL signal caused by a next read cycle and the WL is maintained in enabled state to make the current to flow through the SRAM Bit-Cell 108. (ii) Gate capacitance of a FINFET device (not shown) is more than a gate capacitance of a MOSFET device (not shown) in the SRAM device 100 such that a greater capacitance has to be charged/discharged.

In conventional methods and systems, the power discharging of the SRAM Bit-Cell 108 is reduced by disabling the WL completely for a short period of time using the address decoder 104 and the WL is again enabled during the next read cycle. However, disabling/enabling the WL for a particular period of time is time consuming during the read operation.

SUMMARY

An object of the embodiments herein is to provide methods and apparatus for reducing power dissipation in a Static Random Access Memory (SRAM) device.

Another object of the embodiments herein is to determine whether the discharge of power from a Bit-Line (BL) in a SRAM Bit-Cell exceeds a pre-defined voltage level required for a sense amplifier to perform a read operation.

Another object of the embodiments herein is to improve the power discharged from the BL by controlling the Word-Line Voltage (VDDWL) power supply switch of the WL driver using a Sense Amplifier Enable (SAE) signal and/or by adjusting a pulse width of a Word-Line (WL) to pull down the WL using a N-type Metal-Oxide Semiconductor (NMOS) circuit when the power from the Bit-Line (BL) in the SRAM Bit-Cell exceeds the pre-defined voltage level.

Accordingly, embodiments herein provide a method for reducing power dissipation in a Static Random Access Memory (SRAM) device. The method includes receiving, by an address decoder, an address and an internal clock signal (CLK_INT) for generating a Word-Line (WL) enable signal. The internal clock signal (CLK_INT) may be generated by an internal clock generator during a read operation. Further, the method includes transmitting, by a WL driver, the WL enable signal to at least one SRAM Bit-Cell. The WL enable signal enables at least one WL to select at least one Bit-Line (BL) in the at least one SRAM Bit-Cell. Further, the method includes generating, by a tracking circuit, a Sense Amplifier Enable (SAE) signal and a RESET signal using the internal clock signal (CLK_INT) based on the at least one WL selecting the at least one BL. The SAE signal enables at least one sense amplifier to perform the read operation by reading data of at least one array of the at least one SRAM Bit-Cell. Further, the method may include determining, by the tracking circuit, whether the at least one SRAM bit-cell discharges power from the at least one BL exceeding a pre-defined voltage level required for the at least one sense amplifier to perform the read operation. Furthermore, the method includes reducing, by the WL driver, the power discharged from the at least one BL by controlling a WL voltage (VDDWL) power supply switch of the WL driver using the SAE signal and adjusting a pulse width of the at least one WL to pull down the at least one WL using a NMOS circuit.

In some embodiments, the power discharged from the at least one BL is optimized when the at least one SRAM Bit-Cell discharges the power from the at least one BL exceeding the pre-defined voltage level.

Accordingly, embodiments herein provide an apparatus for reducing power dissipation in a Static Random Access Memory (SRAM). The apparatus includes an address decoder configured to receive an address and an internal clock signal (CLK_INT) for generating a Word-Line (WL) enable signal. The internal clock signal (CLK_INT) may be generated by an internal clock generator during a read operation. Further, the apparatus includes a Word-Line (WL) driver configured to transmit the WL enable signal to at least one SRAM Bit-Cell. The WL enable signal enables at least one WL to select at least one Bit-Line (BL) in the at least one SRAM Bit-Cell. Further, the apparatus includes a tracking circuit configured to generate a Sense Amplifier Enable (SAE) signal and a RESET signal using the internal clock signal (CLK_INT) based on the at least one WL selecting the at least one BL. The SAE signal enables at least one sense amplifier to perform the read operation by reading data of at least one array of the at least one SRAM Bit-Cell and determine whether the at least one SRAM bit-cell discharges power from the at least one BL exceeding a pre-defined voltage level required for the at least one sense amplifier to perform the read operation. Furthermore, the apparatus includes the WL driver further configured to optimize the power from the at least one BL by controlling a WL voltage (VDDWL) power supply switch of the WL driver using the SAE signal and adjusting a pulse width of the at least one WL to pull down the at least one WL using a NMOS circuit.

Accordingly, embodiments herein provide a Static Random Access Memory (SRAM) device for optimizing read power. The SRAM device includes an internal clock generator configured to generate an internal clock signal (CLK_INT) from an external clock (CLK) and a chip enable signal (CSN). The SRAM device may include an address decoder configured to generate a Word-Line (WL) enable signal from an address and the internal clock signal (CLK_INT). The SRAM device may include a tracking circuit configured to generate a sense amplifier enable (SAE) signal and a RESET signal from the internal clock signal (CLK_INT). Furthermore, the SRAM device includes a WL voltage (VDDWL) power supply switch of a WL driver configured to vary a pulse width of the at least one WL during a read operation.

These and other aspects of the embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method is illustrated in the accompanying drawings, throughout which like reference letters indicate corresponding parts in the various figures. The embodiments herein will be better understood from the following description with reference to the drawings, in which.

DETAILED DESCRIPTION

Figure 1:
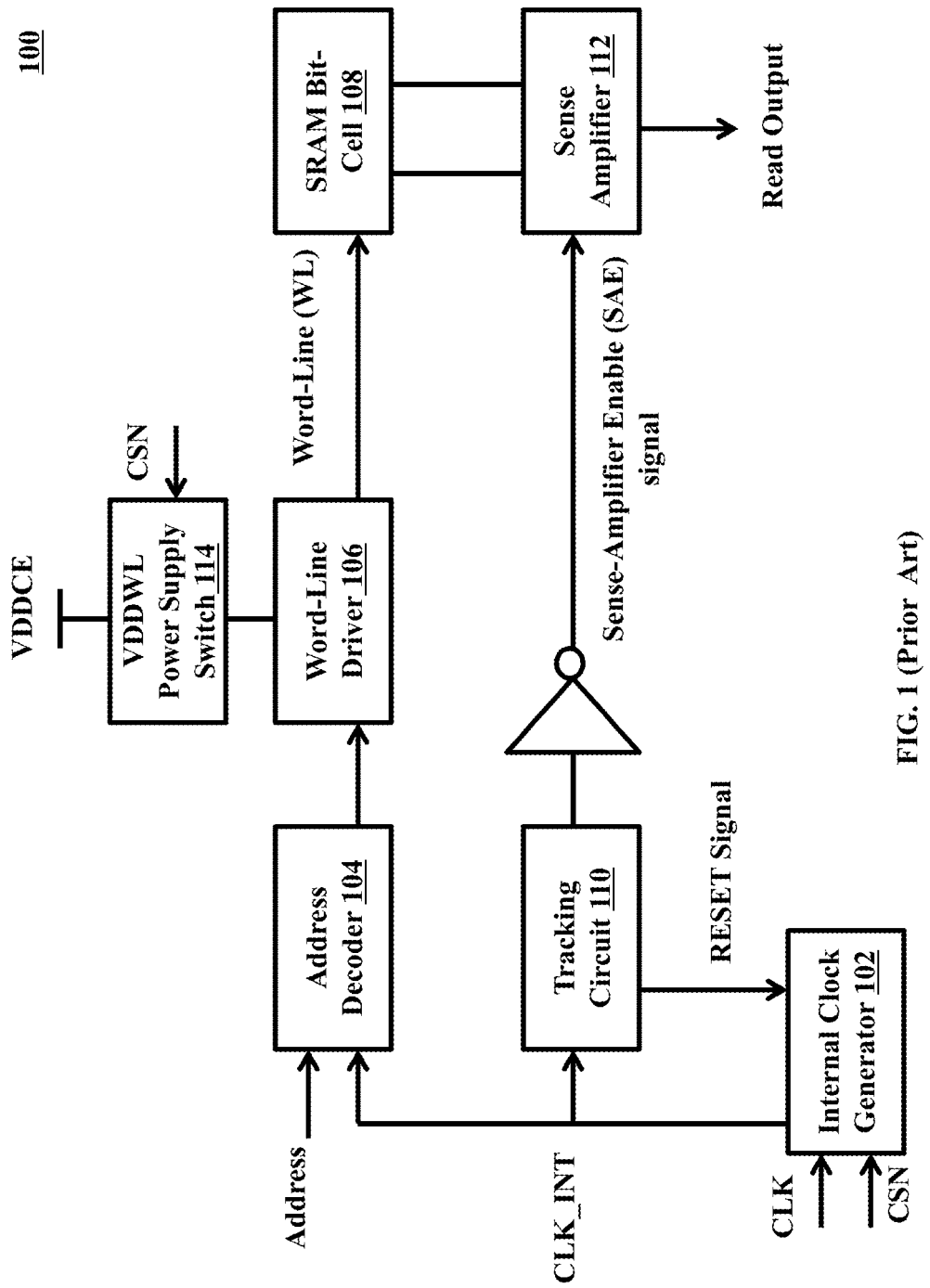
FIG. 1 is a block diagram illustrating various hardware components of a SRAM device performing a read operation.
Figure 2:
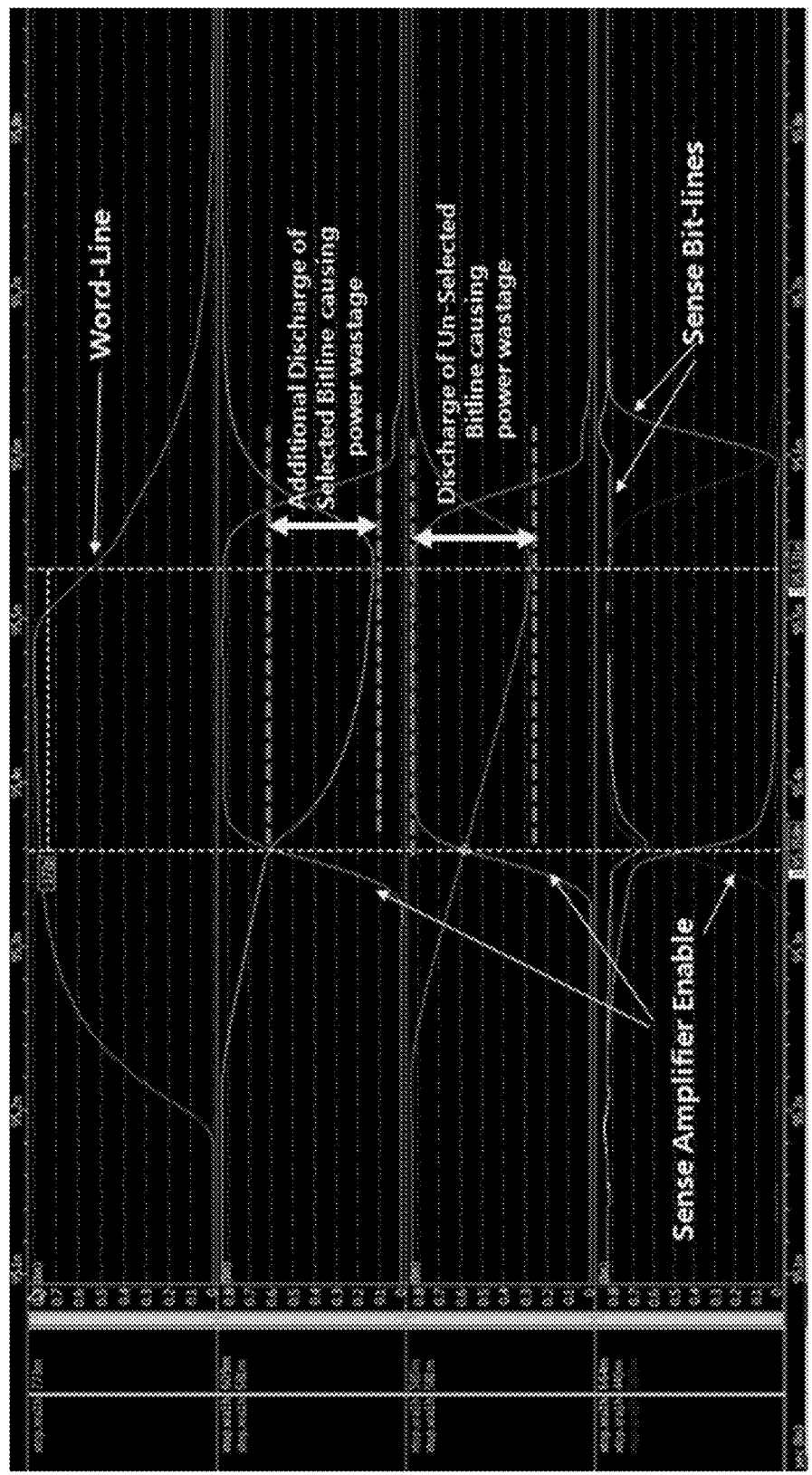
FIG. 2 is a timing diagram illustrating a BL discharge waveform during the read operation.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

Embodiments herein may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Embodiments herein provide a method for reducing power dissipation in a Static Random Access Memory (SRAM) device. The proposed method includes receiving, by an address decoder, an address and an internal clock signal (CLK_INT) for generating a Word-Line (WL) enable signal. The internal clock signal (CLK_INT) is generated by an internal clock generator during a read operation. The method may include transmitting, by a WL driver, the WL enable signal to at least one SRAM Bit-Cell. The WL enable signal may enable at least one WL to select at least one Bit-Line (BL) in the at least one SRAM Bit-Cell. The method may include generating, by a tracking circuit, a Sense Amplifier Enable (SAE) signal and a RESET signal using the internal clock signal (CLK_INT) based on the at least one WL selecting the at least one BL. The SAE signal enables at least one sense amplifier to perform the read operation by reading data of at least one array of the at least one SRAM Bit-Cell. Further, the proposed method includes determining, by the tracking circuit, whether the at least one SRAM bit-cell discharges power from the at least one BL exceeding a pre-defined voltage level required for the at least one sense amplifier to perform the read operation. Furthermore, the method may include optimizing, by the WL driver, the power discharged from the at least one BL by controlling a WL voltage (VDDWL) power supply switch of the WL driver using the SAE signal and/or by adjusting a pulse width of the at least one WL to pull down the at least one WL using a NMOS circuit.

Figure 3:
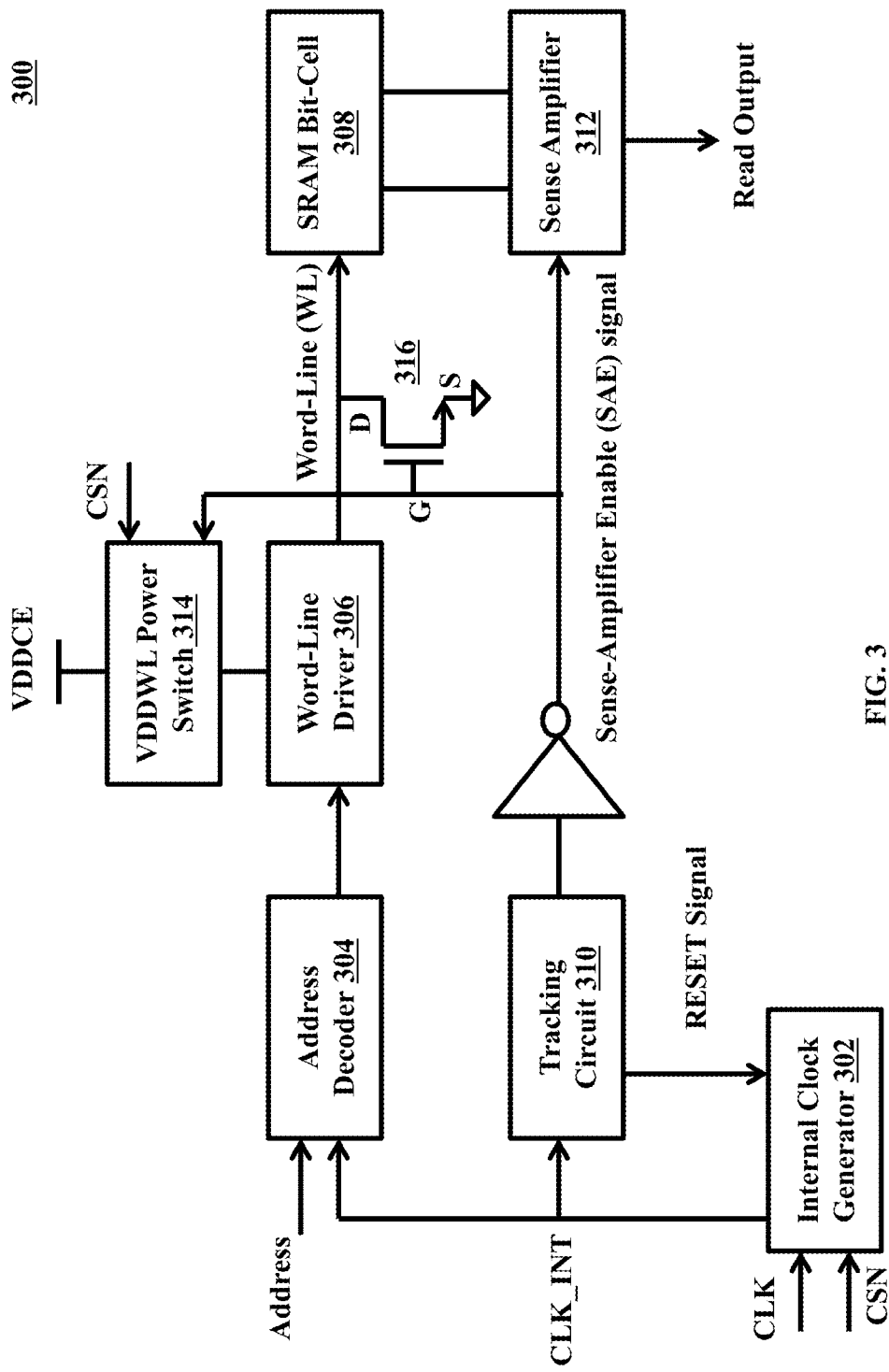
FIG. 3 is a block diagram illustrating an apparatus having various hardware components to perform the read operation, according to embodiments of the present inventive concept.
Figure 4:
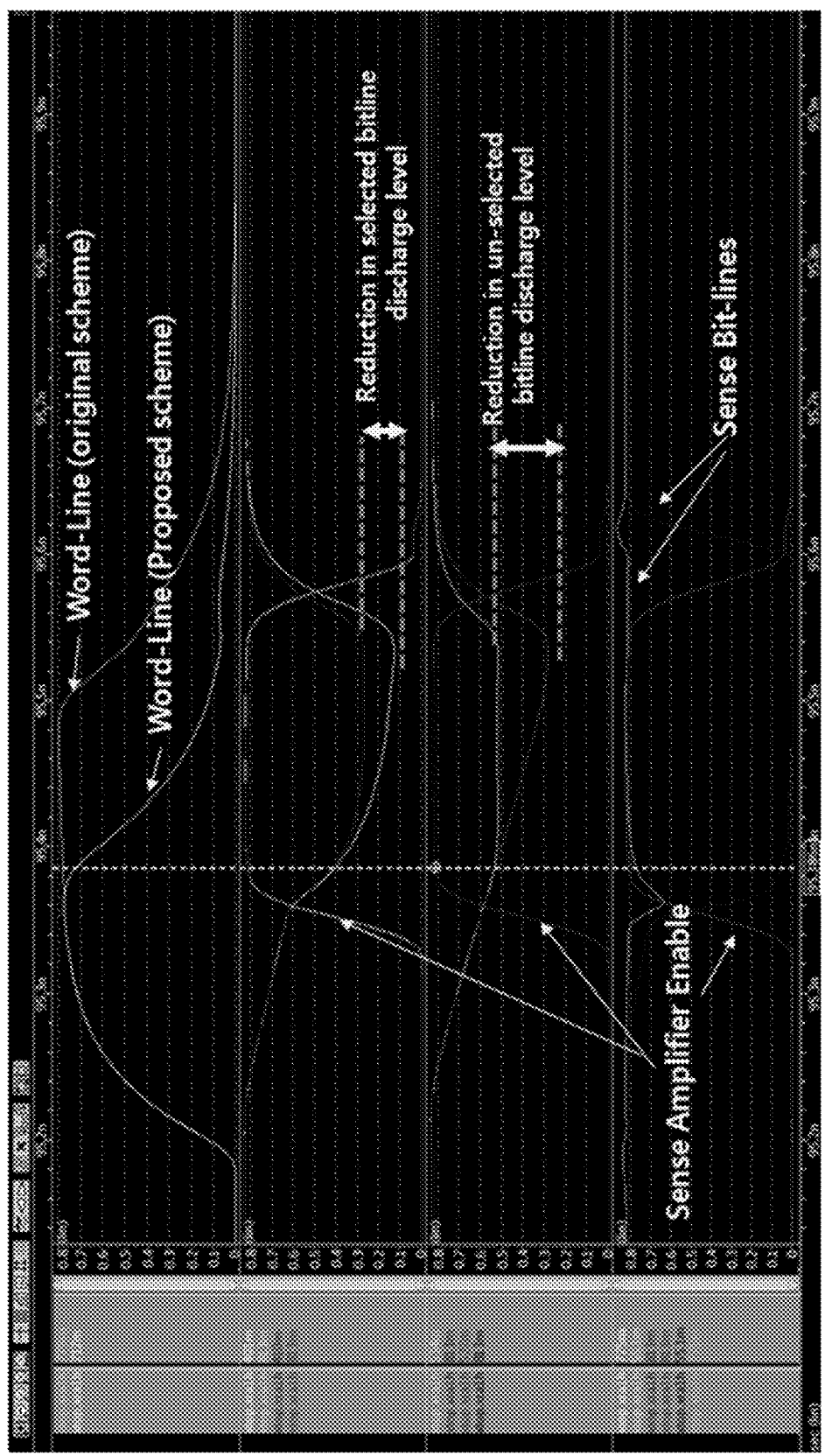
FIG. 4 is a timing diagram illustrating the BL discharge waveform during the read operation, according to embodiments of the present inventive concept.
Figure 5:
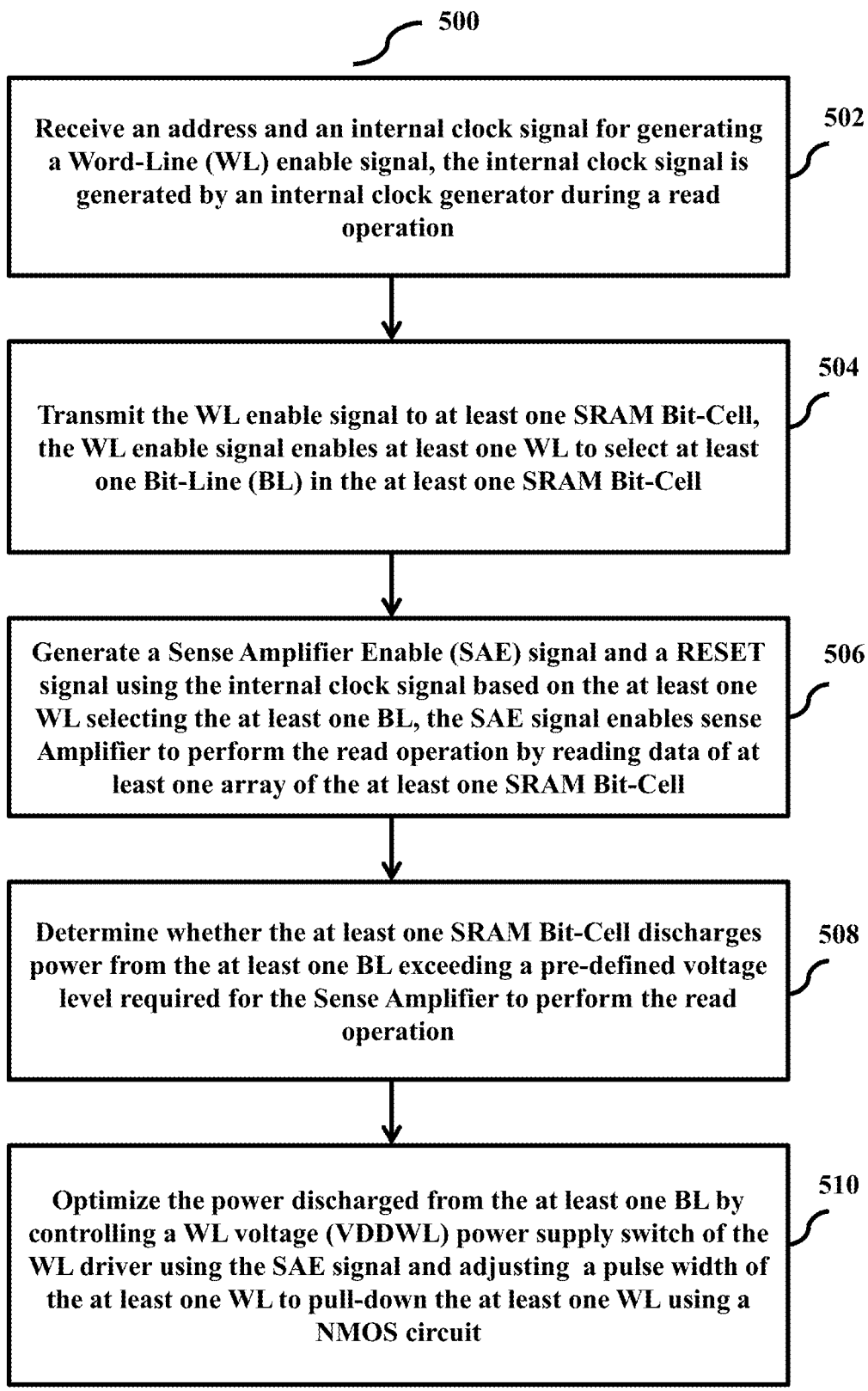
FIG. 5 is a flow diagram illustrating a method to optimize power discharge from the BL, according to embodiments of the present inventive concept.

Referring now to the drawings, and more particularly to FIGS. 3 through 5, various embodiments of the inventive concept will be discussed.

FIG. 3 is a block diagram illustrating an apparatus 300 having various hardware components to perform the read operation, according to embodiments as disclosed herein. In some embodiments, the apparatus 300 may be present in the SRAM device 100. In some embodiments, the apparatus 300 may be a SRAM device. The apparatus 300 may include an internal clock generator 302, an address decoder 304, a Word-Line (WL) driver 306, a SRAM Bit-Cell 308, a tracking circuit 310, a sense amplifier 312, a VDDWL power supply switch 314, and/or a NMOS circuit 316.

The internal clock generator 302 generates an internal clock for the address decoder 304. The internal clock is generated on receiving an external clock (CLK) signal and a Chip Selection Signal (CSN) from external devices (not shown) connected to the apparatus 300. The address decoder 304 receives the internal clock signal from the internal clock generator 302 and receives an address during a read operation to decode the address. After decoding the address, the address decoder 304 generates a WL enable signal.

The WL driver 306 transmits the WL enable signal to the SRAM Bit-Cell 308. The SRAM Bit-Cell 308 includes WLs respectively connected to cells for storage of data and BLs perpendicular to the WLs. The WL enable signal enables a WL in the SRAM Bit-Cell 308 to select a BL in the SRAM Bit-Cell 308 to perform the read operation. When the WL selects the BL in the SRAM Bit-Cell 308, the tracking circuit 310 automatically generates a SAE signal and/or a RESET signal using the internal clock signal from the internal clock generator 302. The SAE signal enables the sense amplifier 312 to perform the read operation by reading data of an array of the SRAM Bit-Cell 308. During the read operation, the SRAM Bit-Cell 308 discharges power from the BL selected by the WL and the BLs which have not been selected by the WL. Therefore, current flows through the apparatus 300.

The tracking circuit 310 determines whether the current flow (i.e., power discharge from the BL) in the apparatus 300 exceeds a pre-defined voltage level required for the sense amplifier 312 to perform the read operation. In some embodiments, the tracking circuit 310 may include or may be coupled with an inverter circuit configured to modify the polarity of the SAE signal. For example, the inverter circuit may invert the SAE signal. When the current flow in the apparatus 300 exceeds a pre-defined voltage level, then the WL driver 306 optimizes power discharge from the BL by controlling the VDDWL power supply switch 314 of the WL driver 306 using the SAE signal and adjusting a pulse width/duration of the WL to pull down the WL using a NMOS circuit 316. The VDDWL power supply switch 314 of the WL driver 306 is adjusted to provide either low power or cut-off the power which is required for the sense amplifier 312 to perform the read operation. NMOS circuit 316 pulls down the WL by grounding (GND) the source of the NMOS circuit 316 and gate of the NMOS circuit 316 at the WL voltage (VDDWL).

Unlike conventional methods and systems, the method and apparatus described herein controls the VDDWL power supply switch 314 and the pulse width/duration of the WL used during the read operation without disabling the WL and again enabling the WL within duration of time. Thus, the current flow in the apparatus is effectively reduced without time constraint.

FIG. 4 is a timing diagram illustrating the BL discharge waveform during the read operation, according to embodiments as disclosed herein. The WL in the SRAM Bit-Cell 308 is pulled down using the NMOS circuit 316 (as mentioned in FIG. 3) such that when the WL in the SRAM Bit-Cell 308 selects the BL in the SRAM Bit-Cell 308, the tracking circuit 310 generates the SAE signal to enable the sense amplifier 312 to read the data of the array of the SRAM Bit-Cell 308. When the sense amplifier 312 reads the data of the array of the SRAM Bit-Cell 308, the SRAM Bit-Cell 308 discharges a lower power from the BL in SRAM Bit-Cell 308 selected by the WL. The lower power discharge from the BLs in the SRAM Bit-Cell 308 which have been not selected by the WL arises due to the pull down of the WL. Therefore, the current flowing through the SRAM Bit-Cell 308 is reduced.

FIG. 5 is a flow diagram 500 illustrating a method to optimize power discharge from the BL, according to embodiments as disclosed herein. At step 502, the method includes receiving the address and the internal clock signal for generating a Word-Line (WL) enable signal. The internal clock signal is generated by an internal clock generator during a read operation. In some embodiments, the method allows the address decoder 304 to receive the address and the internal clock signal for generating a Word-Line (WL) enable signal. The internal clock signal is generated by the internal clock signal generator 302 during a read operation.

At step 504, the method includes transmitting the WL enable signal to at least one SRAM Bit-Cell 308, and the WL enable signal enables at least one WL to select at least one Bit-Line (BL) in the at least one SRAM Bit-Cell 308. In some embodiments, the WL driver 306 transmits the WL enable signal to the at least one SRAM Bit-Cell 308. The WL enable signal may enable at least one WL to select at least one BL in the at least one SRAM Bit-Cell 308.

At step 506, the method includes generating a Sense Amplifier Enable (SAE) signal and a RESET signal using the internal clock signal based on the at least one WL selecting the at least one BL. The SAE signal may enable Sense Amplifier 312 to perform the read operation by reading data from at least one array of the at least one SRAM Bit-Cell 308. In some embodiments, the tracking circuit 310 generates the SAE signal and the RESET signal using the internal clock signal when the at least one WL selects the at least one BL. The SAE signal enables the at least one sense amplifier 312 to perform the read operation by reading the data of the at least one array of the at least one SRAM Bit-Cell 308.

At step 508, the method includes determining whether the at least one SRAM Bit-Cell 308 discharges power from the at least one BL exceeding a pre-defined voltage level required for the at least one sense amplifier 312 to perform the read operation. In some embodiments, the tracking circuit 310 determines whether the at least one SRAM Bit-Cell 308 discharges power from the at least one BL exceeding a pre-defined voltage level that may be required for the at least one sense amplifier 312 to perform the read operation.

At step 510, the method includes reducing and/or optimizing the power discharged from the at least one BL by controlling a WL voltage (VDDWL) power supply switch 314 of the WL driver 306 using the SAE signal and/or adjusting a pulse width of the at least one WL to pull down the at least one WL using a NMOS circuit 316. When the SAE signal is raised to high level, the WL voltage falls. This may reduce the pulse width of the at least one WL, reducing and/or optimizing the amount of power discharge from the BL. In some embodiments, the WL driver 306 may optimize or reduce the power from the at least one BL by controlling a WL voltage (VDDWL) power supply switch 314 of the WL driver 306 using the SAE signal and/or by adjusting a pulse width of the at least one WL to pull down the at least one WL using a NMOS circuit 316.

Unlike conventional methods and systems, the embodiments described herein may directly control the pulse width of the WL based on power dissipation in the SRAM device and may not completely disable the WL during a particular period of time and then enable the WL during a next read cycle. Thus, the power dissipation is reduced effectively without time constraint.

The embodiments disclosed herein can be implemented using at least one software program running on at least one hardware device and/or processor and performing network functions to dynamically control the elements. The elements shown in FIG. 1 through FIG. 5 include blocks which can be at least one of a hardware device, software module, or a combination of hardware device and software module.

The foregoing description of the specific embodiments will so reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A method for reducing power dissipation in a Static Random Access Memory (SRAM) device, the method comprising:
   receiving, by an address decoder, an address and an internal clock signal;
   transmitting, by a WL driver, a WL enable signal to at least one SRAM bit-cell, wherein the WL enable signal enables at least one WL to select at least one bit-line (BL) in the at least one SRAM bit-cell;
   generating, by a tracking circuit, a Sense Amplifier Enable (SAE) signal and a reset signal using the internal clock signal, wherein the SAE signal causes a sense amplifier to perform a read operation by reading data from the at least one SRAM bit-cell;
   determining, by the tracking circuit, whether the at least one SRAM bit-cell discharges power from the at least one BL that exceeds a pre-defined voltage level needed for the sense amplifier to perform the read operation; and
   controlling, by the WL driver, the power discharged from the at least one BL based on a WL voltage power supply switch of the WL driver using the SAE signal and adjusting a pulse width of the at least one WL to pull down the at least one WL.

2. The method of claim 1, wherein a first power discharged from the at least one BL when using the SAE signal and adjusting the pulse width is less than a second power discharged from the at least one BL when not using the SAE signal and not adjusting the pulse width.

3. The method of claim 1, wherein the power discharged from the at least one BL is adjusted when the at least one SRAM bit-cell discharges the power from the at least one BL exceeding the pre-defined voltage level.

4. The method of claim 1, wherein the at least one WL with the pulse width that has been adjusted is applied to an NMOS circuit.

5. The method of claim 4, wherein the at least one WL with the pulse width that has been adjusted is applied to a drain of the NMOS circuit.

6. The method of claim 4, wherein the NMOS circuit pulls down the WL by grounding a source and a gate of the NMOS circuit.

7. The method of claim 1,
   wherein the internal clock signal is generated by an internal clock generator during the read operation, and
   wherein the Word-Line (WL) enable signal is generated based on the address and the internal clock signal.

8. The method of claim 1, wherein the read operation is performed by reading data from at least one array of the at least one SRAM bit-cell.

9. An apparatus for reducing power dissipation in a Static Random Access Memory (SRAM) device, the apparatus comprising:
   an address decoder configured to receive an address and an internal clock signal, wherein a Word-Line (WL) enable signal is generated based on the address and the internal clock signal, wherein a WL driver is configured to transmit the WL enable signal to at least one SRAM bit-cell, and wherein the WL enable signal causes at least one WL to select at least one bit-line (BL) in the at least one SRAM bit-cell; and
   a tracking circuit configured to perform operations comprising:
      generating a Sense Amplifier Enable (SAE) signal and a reset signal using the internal clock signal based on the at least one BL that was selected, wherein the SAE signal causes a sense amplifier to perform a read operation by reading data from the at least one SRAM bit-cell;
      determining whether the at least one SRAM bit-cell discharges power from the at least one BL exceeding a pre-defined voltage level needed for the sense amplifier to perform the read operation,
   wherein the WL driver is further configured to control the power discharged from the at least one BL by controlling a WL voltage power supply switch of the WL driver using the SAE signal and by adjusting a pulse width of the at least one WL to pull down the at least one WL.

10. The apparatus of claim 9, wherein a first power discharged from the at least one BL when using the SAE signal and adjusting the pulse width is less than a second power discharged from the at least one BL when not using the SAE signal and not adjusting the pulse width.

11. The apparatus of claim 10, wherein the WL driver applies the at least one WL with the pulse width that has been adjusted to an NMOS circuit.

12. The apparatus of claim 11, wherein the WL driver applies the at least one WL with the pulse width that has been adjusted to a drain of the NMOS circuit.

13. The apparatus of claim 11, wherein the NMOS circuit is configured to pull down the WL by grounding a source and a gate of the NMOS circuit.

14. The apparatus of claim 10, wherein the power discharged from the at least one BL is adjusted in response to the at least one SRAM bit-cell discharging the power from the at least one BL exceeding the pre-defined voltage level.

15. The apparatus of claim 10, further comprising:
an internal clock generator configured to generate the internal clock signal during the read operation.

16. The apparatus of claim 10, wherein the read operation is performed by reading data from at least one array of the at least one SRAM bit-cell.

17. A Static Random Access Memory (SRAM) device for reducing read power, the SRAM device comprising:
an internal clock generator configured to generate an internal clock signal based on an external clock (CLK) and a chip enable signal (CSN);
an address decoder configured to generate a Word-Line (WL) enable signal from an address and the internal clock signal;
a tracking circuit configured to generate a sense amplifier enable (SAE) signal and a reset signal based on the internal clock signal; and
a WL driver comprising a WL voltage power supply switch,
wherein the WL driver is configured to vary a pulse width of at least one WL during a read operation.

18. The SRAM device of claim 17, further comprising:
an NMOS circuit that is configured to pull down the at least one WL.

19. The SRAM device of claim 17,
wherein a first power is discharged during the read operation responsive to the pulse width being varied or a second power is discharged during the read operation responsive to the pulse width not being varied, and
wherein the first power is less than the second power.

20. The SRAM device of claim 19,
wherein the read operation is performed by reading data from an SRAM bit-cell of the SRAM device, and
wherein the first power or the second power is associated with a Word-Line (WL) that is used to select the SRAM bit-cell of the SRAM device.

* * * * *